METHOD OF MAKING A VARACTOR DIODE BY EPITAXIAL GROWTH AND DIFFUSION

Filed Sept. 20, 1960

DEPOSIT IMPURITY LAYER
PREPARE SURFACE

GROW EPITAXIAL FILM

INVENTORS A. R. BRAY
D. KAHNG
BY H W Lockhart
ATTORNEY

United States Patent Office 3,149,395

Patented Sept. 22, 1964

3,149,395

METHOD OF MAKING A VARACTOR DIODE BY EPITAXIAL GROWTH AND DIFFUSION

Anthony R. Bray, Chatham, and Dawon Kahng, Plainfield, N.J., assignors to Bell Telephone Laboratories, Incorporated, New York, N.Y., a corporation of New York Filed Sept. 20, 1960, Ser. No. 57,345
7 Claims. (Cl. 29—25.3)

This invention relates to semiconductor translating devices and has particular application to varactor diodes, although it is not limited thereto.

A varactor diode is a semiconductor diode comprising a semiconductor wafer which includes a PN junction whose capacitance is highly sensitive to the voltage across the junction. Accordingly, the device operates as a voltage variable capacitor from which the term "varactor" is derived. The larger the rate of change of capacitance with a change in voltage the higher is the figure of merit for such a device. Varactor diodes find use in parametric amplifiers, harmonic generators and tuning elements.

This invention is directed particularly to a varactor diode which has a figure of merit superior to the conventional form and to a method for fabricating it.

Therefore, a general object of this invention is a method for fabricating semiconductor devices of improved characteristics.

A more specific object is a method for fabricating varactor diodes of improved characteristics.

In accordance with this invention a layer of a significant impurity termed the "diffusant" is deposited initially on one surface of a semiconductor wafer which already includes a significant impurity termed the "dopant" of the opposite conductivity type. The diffusant is chosen advantageously to have a diffusion constant much higher than that of the dopant. Next an epitaxial layer of semiconductor material is grown on top of the first deposited layer. It will be understood that epitaxial layer refers to a layer formed on the substrate by any one of several methods known in the art to have the same crystalline orientation and structure as the substrate. Ideally, the grown material is a crystallographic extension of the substrate.

During the growth of the epitaxial layer or, alternatively, in a subsequent heating step, the significant impurity is made to diffuse from the initially-deposited layer both into the substrate and into the epitaxial layer. However, the relative concentrations are chosen such that the diffusant has little effect on the substrate but a predominant effect in the epitaxial layer. By an appropriate choice of impurities and heating treatment, there can be formed essentially a retrograded junction in the epitaxial layer. A retrograded junction is one characterized by a relatively sharp decrease in concentration with distance away from the junction of the predominant significant impurity in the depletion layer on at least one side of the junction. Such a retrograded junction has a capacitance which varies sharply with variations in a reverse voltage maintained across the junction and accordingly, is advantageously included in a varactor diode.

Therefore, a feature of this invention is a varactor diode which includes an epitaxial layer in which there is a retrograded junction.

The invention and its further objects, features and advantages will be understood more clearly from the following detailed description rendered in connection with the drawing in which.

It is to be understood that the figures are for illustrative purposes only, and therefore, are not necessarily to scale.

Figure 1:
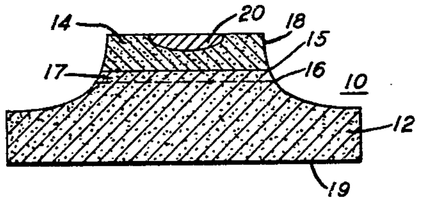
FIG. 1 is a cross section of an embodiment of this invention in its completed form.

With reference now more specifically to the drawing, the varactor diode 10 shown in FIG. 1 comprises an essentially monocrystalline silicon wafer which includes an n-type zone 12 which forms the bulk portion of the wafer and a p-type zone 14 defining therebetween a rectifying junction 15. The rectifying junction is retrograded, the predominant significant impurity in zone 14 having a concentration which decreases with increasing distance away from the junction. As will be described in more detail, the junction 15 is located in a portion of the wafer which was grown as an epitaxial layer. The original surface of the wafer before such growth is designated in the drawing by the broken line 16. The n-type zone 12 includes a thin layer 17 which extends between the rectifying junction 15 and the original surface 16 of the wafer. The rectifying junction is located in a mesa-like portion 18 of the wafer in a manner now familiar for high frequency diodes.

Electrodes 19 and 20 make low resistance ohmic connections to zones 12 and 14, respectively.

Figure 2A:
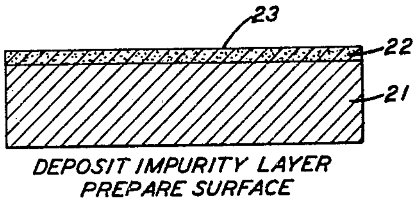
FIGS. 2A and 2B are cross sections of the device of FIG. 1 in its various stages of fabrication.
Figure 2B:
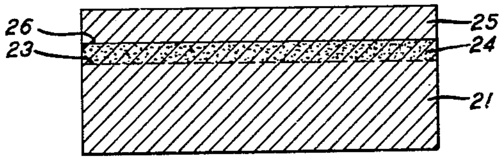

The fabrication of a diode of the kind described in accordance with the invention is illustrated in FIGS. 2A and 2B which represent different stages in its fabrication.

It will be helpful to describe the fabrication of a diode of specific design.

First, there is prepared a monocrystalline slice of arsenic-doped silicon, the arsenic concentration being uniformly about $10^{20}$ atoms per cubic centimeter. Advantageously, the slice has lateral dimensions much larger than those desired for a single element so that by subsequent slicing, many individual elements are made available. Typically, the slice can be 250 mils square and 5 mils thick.

One square face of the slice is thereafter exposed for about one hour at a temperature of about 1250 degrees centigrade, to a boron-rich atmosphere, typically a mixture of $B_2O_3+SiO_2$ where the $B_2O_3$ constitutes between .01 and .001 percent of the mixture by volume, to provide a thin layer with a boron concentration of about $10^{18}$ atoms per cubic centimeter. FIG. 2A shows the slice at this stage comprising an n-type slice 21 having a thin boron-diffused layer 22 at one surface 23.

The slice next is prepared to serve as a suitable substrate upon which an epitaxial layer may be deposited. Accordingly, the boron-rich surface is carefully polished, etched and cleaned to provide the substantially undamaged substrate necessary for the successful growth of an epitaxial layer. Although the growth of an epitaxial layer can occur, along any of the major crystallographic axes, the preferred orientation for the process described is along the <111> direction as the most advantageous from the standpoint of subsequent processing. Accordingly, the slice is cut orginally from a <111> oriented ingot so that the boron-rich surface will be as desired. Typically, the surface is ground flat with 1800 silicon carbide, etched by a countercurrent flow method in a mixture of concentrated nitric acid and five percent hydrofluoric acid, then cleaned in hydrochloric acid and washed with de-ionized water. This treatment, however, is such as still to leave a considerable fraction of the original boron-rich layer.

The slice is thereafter exposed first to a flow of pure dry hydrogen at a temperature of 1200 degrees centigrade for about 30 minutes. Immediately following this heat treatment, the slice is exposed to an atmosphere of hydrogen saturated with silicon tetrachloride vapor at the above temperature. Typically, the ratio of silicon tetrachloride vapor to hydrogen gas is about 0.02 but may be in the range from fractions of one percent to generally about 20 percent depending on the temperature of the reaction and the time and flow rate. It should be appreciated that the rate of growth of the epitaxial layer is responsive directly to both the duration and the temperature of the process. Generally, the growth of the epitaxial layer can be carried out at temperatures in the range from 850 degrees centigrade to 1400 degrees centigrade and for periods extending from minutes to hours. These parameters determine the final film thickness of the layer and using a silicon tetrachloride to hydrogen ratio of 0.02 with a flow rate of one liter per minute for one minute a layer about .1 mil in thickness is produced. Further details on the process and apparatus for the growth of an epitaxial layer can be found in Patent No. 2,692,839 issued October 26, 1954 to H. Christensen and G. Teal, and in the copending application Serial No. 35,152 filed June 10, 1960 for J. J. Kleimack, H. H. Loar and H. C. Theuerer and assigned to the assignee of the present application.

Generally, the epitaxial layer will be deposited uniformly on all surfaces of the slice. However, only the layer on the prepared surface of the slice is of interest in connection with the method of this invention. More particularly, this layer is of a high quality, single crystal material having the same orientation as the slice substrate. The layer would tend to be of high resistivity in the absence of any diffusion therein from the substrate.

However, during the growth of the epitaxial layer the boron and the arsenic diffuse. Because of the higher diffusion constant of boron, the boron tends to diffuse into the film to a greater depth than the arsenic. This depth should be sufficient that the electrode connection later to be provided to the epitaxial film penetrates to a boron-rich region only a small distance from the original surface. As a result, a rectifying junction is formed in the epitaxial layer in slightly from the original surface. In the epitaxial film, the boron concentration will decrease with increasing distance from the original surface.

FIG. 2B shows the slice at this stage. An epitaxial film has been grown on original surface 23 which includes an arsenic-rich n-type region 24 adjacent surface 23 and a boron-rich region 25 forming an exposed surface. The rectifying junction 26 is formed between regions 24 and 25.

There remains to provide electrode connections, to form the mesas, and to cut the slice into individual elements. As discussed above, the electrode connection to the epitaxial film, typically an aluminum dot alloyed to the film, penetrates to a boron-rich region. Conventional techniques can be used for such purposes. After the completion of such steps, each element is as shown in FIG. 1. Typically, the slice is cut into elements 5 mils square.

Figure 3:
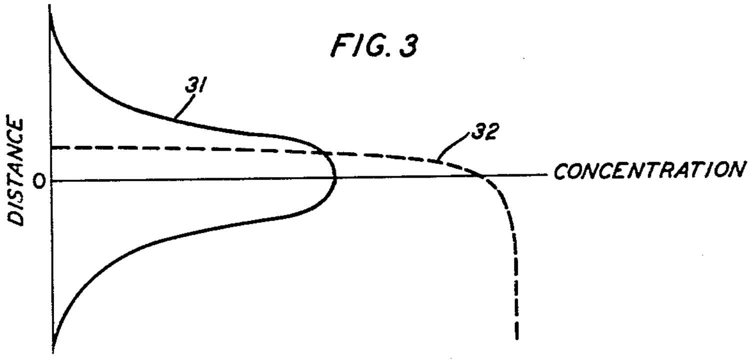
FIG. 3 is a graph of the impurity distribution in the region of the retrograded junction.

FIG. 3 is a graph representing a typical distribution of the impurities in the device of FIG. 1. The graph is drawn so that the abscissa of the graph or the "concentration" axis corresponds to surface 16 while positive and negative distance can be thought of as distance into the epitaxial layer and the substrate, respectively. The boron concentration represented by solid line 31 reaches a peak at the interface between the substrate and the epitaxial film and decreases rapidly with distance from this interface. The intersection of broken line 32, which represents the arsenic concentration, and the solid line 31 determines the position of the retrograded junction 15. The higher level of impurities on the arsenic-rich side of the junction insures that the space charge layer largely forms on the boron-rich side of the junction so that the capacitance of the junction is primarily influenced by the retrograded portion.

Figure 4:
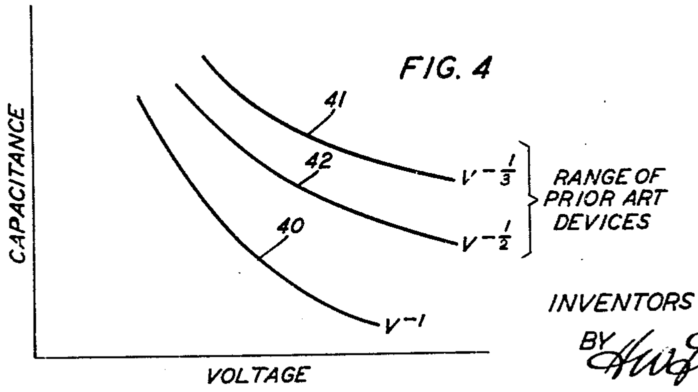
FIG. 4 is a graph of a typical capacitance-voltage characteristic of the device of FIG. 2B and the characteristic of typical prior art devices.

FIG. 4 is a capacitance-voltage graph on which is plotted a curve 40 representing a typical response exhibited by a device in accordance with this invention. The curve has a shape approaching $V^{-1}$ which indicates a relatively large change in capacitance for a given change in input voltage.

More specifically, the prior art devices exhibit characteristics which lie typically between curves 41 and 42 corresponding to $V^{-1/3}$ and $V^{-1/2}$, respectively. The shape of the curves indicates that a much larger input voltage swing is necessary in prior art devices than is necessary for a device in accordance with this invention to achieve a given change in capacitance.

In way of an explanation, the capacitance response exhibited by any varactor diode depends upon the final distribution of the significant impurities about the PN junction included in the device. Specifically, the capacitance response exhibited by the device depends on the change in the width of the space charge region associated wtih the PN junction. As applied voltage is increased suitably, free charges are swept clear of their associated ionized impurities adjacent the PN junction. These impurities are now "uncovered" and the width of the space charge region increases accordingly. In a retrograded junction, the concentration of diffusant decreases sharply with distance from the PN junction. As a consequence an increase in applied voltage, although uncovering as many ionized impurities as in an ordinary PN junction, necessarily extends further to find this number of impurities. Thus, the width of the associated space charge region increases more quickly than in devices including an ordinary PN junction and, accordingly, capacitance decreases more quickly.

There are general considerations important in the fabrication of devices in accordance with this invention. First, the dopant and diffusant are selected such that the diffusant has a higher diffusion coefficient than the dopant, typically two orders of magnitude (i.e., $10^2$) depending on the relative concentrations of the diffusant and the dopant. Accordingly, since any one of the available significant impurities is suitable individually, appropriate pairs of impurities can be designated for any particular semiconductor material. Typical pairs for the most promising semiconductors are

| Silicon | | Germanium | | Gallium arsenide | |
|---|---|---|---|---|---|
| Diffusant | Dopant | Diffusant | Dopant | Diffusant | Dopant |
| Indium | Arsenic, Antimony | Phosphorus | Gallium, Indium | Zinc, Copper | Silicon |
| Boron | Arsenic, Antimony | Arsenic | Gallium, Indium | | |

Moreover, the diffusant advantageously is deposited to have a surface concentration about two orders of magnitude lower than the concentration of the dopant and at least a factor of two (i.e. one-half) lower. This is to insure that the space charge layer forms primarily on the retrograded side of the junction.

Also, the epitaxial film as grown need not be of any particular conductivity type. It is only necessary that the film be such that penetration therein by the diffusant either during the growing of the film or by a separate subsequent heating step can form a retrograded junction. In this connection, silicon tetrachloride is a preferred compound for use in growing epitaxial layers on silicon substrate and generally the halides of both silicon and germanium, respectively, can be used most advantageously for the growth of such layers. In particular, germanium tetrachloride and iodide are suitable for use in growing germanium epitaxial films. However, while epitaxial films usually are of the same semiconductor material as the substrate, as is known to workers in the art, the epitaxial film may be of a different semiconductor material.

No effort has been made to exhaust the possible embodiments of the invention. It will be understood that the embodiment described is merely illustrative of the preferred form of the invention and various modifications may be made therein without departing from the scope and spirit of this invention.

For example, although the invention is described in terms of a specific structure, it may be practiced on one or more portions of a more complicated structure already including a PN junction.

What is claimed is:

1. The process of fabricating a varactor diode comprising the steps of forming on a surface portion of a semiconductive wafer a diffusant-rich layer, the diffusant having a conductivity-type determining characteristic opposite that of the doping impurity predominant in the adjacent portion of the wafer, the diffusant having a diffusion constant larger than that of said doping impurity and the concentration of said diffusant in said layer being lower than that of said doping impurity in said adjacent portion, growing a high resistivity epitaxial film over said diffusant-rich surface portion, the diffusant diffusing further into said film than said dopant whereby there is formed in the epitaxial film a retrograded junction characterized by a sharply decreasing concentration of the diffusant with increasing distance away from the junction into the epitaxial film.

2. The process of fabricating a varactor diode comprising the steps of forming on a surface portion of a semiconductive wafer a diffusant-rich layer, the diffusant having a conductivity-type determining characteristic opposite that of the doping impurity predominant in the adjacent portion of the wafer, the diffusant having a diffusion constant about two orders of magnitude larger than that of said doping impurity and the concentration of said diffusant in said layer being about two orders of magnitude lower than that of said doping impurity in said adjacent portion, growing a high resistivity epitaxial film over said diffusant-rich surface portion, the diffusant diffusing further into said film than said dopant whereby there is formed in the epitaxial film a retrograded junction characterized by a sharply decreasing concentration of the diffusant with increasing distance away with the junction into the epitaxial film.

3. The process of fabricating a varactor diode comprising the steps of forming on a surface portion of a semiconductive wafer a diffusant-rich layer, the diffusant having a conductivity-type determining characteristic opposite that of the doping impurity predominant in the adjacent portion of the wafer, the diffusant having a diffusion constant between one and two orders of magnitude larger than that of said doping impurity and the concentration of said diffusant in said layer being between one and two orders of magnitude lower than that of said doping impurity in said adjacent portion, growing a high resistivity epitaxial film over said diffusant-rich surface portion, the diffusant diffusing further into said film than said dopant whereby there is formed in the epitaxial film a retrograded junction characterized by a sharply decreasing concentration of the diffusant with increasing distance away from the junction into the epitaxial film.

4. The process of fabricating a varactor diode comprising the steps of forming on a surface portion of a semiconductive wafer a diffusant-rich layer, the diffusant having a conductivity-type determining characteristic opposite that of the doping impurity predominant in the adjacent portion of the wafer, the diffusant having a diffusion constant at least a factor of two larger than that of said doping impurity and the concentration of said diffusant in said layer being at least a factor of two lower than that of said doping impurity in said adjacent portion, growing a high resistivity epitaxial film over said diffusant-rich surface portion, the diffusant diffusing further into said film than said dopant whereby there is formed in the epitaxial film a retrograded junction characterized by a sharply decreasing concentration of the diffusant with increasing distance away from the junction into the epitaxial film.

5. In the process of fabricating semiconductor devices the steps of prediffusing an impurity of a first conductivity type into a major surface of a semiconductor wafer of the opposite conductivity type, depositing a high resistivity epitaxial film on said major surface and heating for a time and at a temperature to form a retrograded junction adjacent said major surface.

6. A process for fabricating varactor diodes comprising prediffusing an impurity of a first conductivity type into a major surface of a wafer including an impurity of the opposite conductivity type, depositing a high resistivity epitaxial film on said major surface, heating for a time and at a temperature to form a retrograded junction adjacent said major surface and attaching a separate ohmic contact to each side of said junction.

7. A process for fabricating varactor diodes comprising prediffusing boron into a major surface of a silicon wafer including a concentration of arsenic, depositing a high resistivity epitaxial film on said major surface, heating for a time and at a temperature to form a retrograded junction adjacent said major surface and attaching an ohmic contact to each side of said junction.

References Cited in the file of this patent

UNITED STATES PATENTS

| | | |
|---|---|---|
| 2,824,269 | Ohl | Feb. 19, 1958 |
| 2,829,422 | Fuller | Apr. 8, 1958 |
| 2,842,831 | Pfann | July 15, 1958 |
| 2,931,958 | Arthur et al. | Apr. 5, 1960 |
| 2,937,324 | Kroko | May 17, 1960 |
| 2,940,022 | Pankove | June 7, 1960 |
| 2,968,750 | Noyce | Jan. 17, 1961 |
| 3,006,789 | Nijland | Oct. 31, 1961 |
| 3,006,791 | Webster | Oct. 31, 1961 |
| 3,014,820 | Marinace | Dec. 26, 1961 |
| 3,070,466 | Lyons | Dec. 25, 1962 |
| 3,076,731 | Wannlund | Feb. 5, 1963 |
| 3,089,794 | Marinace | May 14, 1963 |

OTHER REFERENCES

IBM Technical Disclosure "P–N Junction Fabrication," July 1960, vol. 3, No. 2, p. 45.

Handbook of Automation and Control, New York, John Wiley, 1961 p. 26–22, TJ 213 G7h.